(12) United States Patent
Peeters et al.

(10) Patent No.: US 10,624,167 B2
(45) Date of Patent: Apr. 14, 2020

(54) AC-LED WITH HYBRID LED CHANNELS

(71) Applicant: SIGNIFY HOLDING B.V., Eindhoven (NL)

(72) Inventors: Martinus Petrus Joseph Peeters, Weert (NL); Shu Xu, Shanghai (CN); Jie Fu, Shanghai (CN); Malgorzata Perz, Eindhoven (NL); Rémy Cyrille Broersma, Eindhoven (NL); Dragan Sekulovski, Eindhoven (NL); René Theodorus Wegh, Veldhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 255 days.

(21) Appl. No.: 15/735,697

(22) PCT Filed: Jun. 6, 2016

(86) PCT No.: PCT/EP2016/062760
§ 371 (c)(1),
(2) Date: Dec. 12, 2017

(87) PCT Pub. No.: WO2016/198348
PCT Pub. Date: Dec. 15, 2016

(65) Prior Publication Data
US 2020/0037409 A1    Jan. 30, 2020

(30) Foreign Application Priority Data

Jun. 12, 2015  (WO) ................. PCT/CN2015/081365
Oct. 29, 2015  (EP) ..................................... 15192079

(51) Int. Cl.
*H05B 33/08*    (2020.01)
*H01L 33/50*    (2010.01)
*H05B 33/12*    (2006.01)

(52) U.S. Cl.
CPC ....... *H05B 33/0842* (2013.01); *H01L 33/502* (2013.01); *H05B 33/12* (2013.01)

(58) Field of Classification Search
CPC .... H05B 33/02; H05B 33/08; H05B 33/0803; H05B 33/083; H05B 33/0842; H05B 33/14
See application file for complete search history.

(56) References Cited

U.S. PATENT DOCUMENTS

| 8,471,495 B2 * | 6/2013 | Muguruma | .......... H05B 33/083 |
| | | | 315/185 R |
| 8,569,956 B2 * | 10/2013 | Shteynberg | .......... H05B 33/083 |
| | | | 315/123 |

(Continued)

FOREIGN PATENT DOCUMENTS

| WO | 2005030904 A1 | 4/2005 |
| WO | 2013088313 A1 | 6/2013 |
| WO | 2014068440 A1 | 5/2014 |

OTHER PUBLICATIONS

Chiao-Wen Yeh, et al., "Appropriate Green Phosphor of SrSi2O2N2:EU2+,Mn2+ for AC LEDs," Optics Express, 2012 (13 Pages).

(Continued)

*Primary Examiner* — Jason Crawford

(57) ABSTRACT

The invention provides a light emitting diode (LED) lighting system (1) comprising a string (ST) including a number of light emitting diode (LED) elements (10) functionally connected with an AC voltage source (20) configured to apply an input voltage (Vi) to said string (ST), wherein the string (ST) comprises a plurality of segments (S1, S2, S3, . . . ), with each segment (S1, S2, S3, . . . ) comprising at least one or more of said light emitting diode (LED) elements (10), wherein the light emitting diode (LED) lighting system (1) is configured to connect a first segment (S1) in the string (Continued)

(ST) between and driven by the input voltage (Vi) when said input voltage (Vi) is bigger than a first threshold, and to connect the first segment (S1) and a second segment (S2) in the string between and driven by the input voltage (Vi) when said input voltage (Vi) is bigger than a second threshold bigger than said first threshold, wherein each LED element (10) comprises a light emitting diode (100) configured to generate blue LED radiation (101), wherein said first segment (S1) comprises a second photoluminescent material comprising LED element (210), wherein the second photoluminescent material comprising LED element (210) comprises (a) light emitting diode (100) and (b) a second photoluminescent material (230) configured to convert at least part of said LED radiation (101) into second conversion radiation (231) in the visible, and wherein said second photoluminescent material (230) only has a decay time of the second conversion radiation (231) smaller than 1 ms, and said second segment (S2) comprise first photoluminescent.

13 Claims, 3 Drawing Sheets

(56) References Cited

U.S. PATENT DOCUMENTS

| | | | | |
|---|---|---|---|---|
| 8,917,026 | B2* | 12/2014 | Ferrier | H05B 33/083 315/119 |
| 9,398,655 | B2* | 7/2016 | Rupp | H05B 33/083 |
| 9,572,212 | B2* | 2/2017 | Yoo | H05B 33/0815 |
| 9,844,114 | B2* | 12/2017 | Chowdhury | H05B 33/0809 |
| 2009/0160363 | A1 | 6/2009 | Negley et al. | |
| 2010/0109570 | A1* | 5/2010 | Weaver | H05B 33/0812 315/295 |
| 2010/0134016 | A1* | 6/2010 | York | F21V 23/0442 315/113 |
| 2010/0194274 | A1* | 8/2010 | Hoogzaad | H05B 33/0803 315/51 |
| 2011/0273102 | A1* | 11/2011 | van de Ven | H05B 33/0809 315/193 |
| 2012/0229038 | A1 | 9/2012 | Zeng et al. | |
| 2012/0262075 | A1* | 10/2012 | Lynch | H05B 33/0818 315/192 |
| 2013/0187556 | A1 | 7/2013 | Zeng et al. | |
| 2014/0125229 | A1 | 5/2014 | Ni | |
| 2014/0252992 | A1* | 9/2014 | Radermacher | H05B 33/0815 315/307 |
| 2014/0265921 | A1* | 9/2014 | Collins | F21V 19/00 315/297 |
| 2014/0300278 | A1* | 10/2014 | Van Bodegraven | H05B 33/0827 315/153 |
| 2015/0102262 | A1 | 4/2015 | Jia | |
| 2015/0137701 | A1* | 5/2015 | Siessegger | H05B 33/0806 315/294 |
| 2015/0173142 | A1* | 6/2015 | Van Der Veen | H05B 33/0851 315/151 |
| 2017/0263592 | A1* | 9/2017 | Schmidt | C09K 11/02 |

OTHER PUBLICATIONS

Jennifer L. Wu, et al., "Spectral Properties of Various Cerium Doped Garnet Phosphors for Application in White GaN-Based LEDs," Mat. Res. Soc. Symp. Proc. vol. 658, 2001 (6 Pages).

* cited by examiner

AC-LED WITH HYBRID LED CHANNELS

CROSS-REFERENCE TO PRIOR APPLICATIONS

This application is the U.S. National Phase application under 35 U.S.C. § 371 of International Application No. PCT/EP2016/062760, filed on Jun. 6, 2016, which claims the benefit of International Application No. PCT/CN2015/081365, filed on Jun. 12, 2015 and European Patent Application No. 15192079.0, filed on Oct. 29, 2015. These applications are hereby incorporated by reference herein.

FIELD OF THE INVENTION

The invention relates to an AC driven light emitting diode lighting system, especially based on the tapped linear driver principle.

BACKGROUND OF THE INVENTION

The use of photoluminescent materials in the context of solid state lighting is known in the art. US2014/0265921, for instance, describes that a light emitting device can include a solid state lighting source and a luminophoric medium for down-converting at least some of the radiation emitted by the solid state lighting source. The luminophoric medium may include a first material that down-converts the radiation emitted by the solid state lighting source to radiation having a first peak wavelength and that has a first decay time. The luminophoric medium may include a second material that down-converts the radiation emitted by the solid state lighting source to radiation having a second peak wavelength and that has a second decay time that is longer than the first decay time.

SUMMARY OF THE INVENTION

AC-LEDs are considered a trend for future LED devices because AC-LEDs may require substantially less electrical power components and (thus) reduced system costs and an increased reliability can be obtained with AC-LEDs compared to DC LEDs. Nevertheless, current AC-LEDs have several fundamental disadvantages that limit its application. The top disadvantage is flicker, which is caused by non-linear voltage fluctuation with an AC frequency of e.g. 100 Hz (10 ms per cycle). Such flicker may cause considerable stroboscopic effect and damage human's health. Reduction of flicker is thus desired.

According to flicker index calculation formula, for a given percent flicker value ($\rho$, in percent), the frequency at which a rating of zero, corresponding to the borderline between acceptability and unacceptability of stroboscopic effects ($f_b$, in Hz), is calculated as follows:

$$f_b = 130 \log \rho - 73 \quad \text{(eq. S1)}$$

For a given flicker frequency (f, in Hz), and using the borderline frequency ($f_b$, in Hz) calculated in equation S1, the resulting acceptability (a, based on the scale above) can be estimated as follows:

$$a = 2 - 4/(1 + f/f_b) \quad \text{(eq. S2)}$$

According to ASSIST (The Alliance for Solid-State Illumination Systems and Technologies), the safety flicker depth at 100 Hz will be ~0.24. The depth above 0.36 is considered as medium risk and 0.7 is considered as high risk.

It appears that such flicker can be removed or reduced by introducing some current ripple filtering circuit which includes many power components, such as e.g. using capacitors. This solution seems, however, somewhat in conflict to the application of AC-LED concept because it is accompanied with large driver space, lower reliability and extra costs; i.e. those aspects that the AC-LED principle tries to avoid.

Further, it also appears that flicker can be removed by adopting long photoluminescence decay phosphors (PL decay time is >100 ms, such as even above 500 ms, comparing to typical short decay phosphor with PL decay time of 100 ns-10 us). Nevertheless, such long decay phosphors with blue absorption unfortunately appeared to have rather low light conversion efficiencies. Hence, they appear not to be suitable to be used in current AC-LED system based on blue emission LEDs. Therefore, also this is unfortunately not one applicable solution.

US2013187556A1 discloses a long decay phosphors for lighting applications. It includes both the long decay phosphor and conventional red phosphor to LEDs that directly connected between the AC mains input. US2012229038A1 millisecond decay phosphors for AC LED lighting applications, and it also includes this phosphors and red phosphor. Drawback in those prior arts are low efficiency since the long decay phosphors is low efficient and it receive full power from the AC mains that powers all LEDs.

Hence, it is an aspect of the invention to provide an alternative current LED-based lighting system, which preferably further at least partly obviates one or more of above-described drawbacks. It is especially an aspect of the invention to provide a reliable, relatively cheap, and robust LED based lighting system, with especially a minimum of electrical components.

It was surprisingly found that it is not necessary to use LEDs with fully long decay phosphor encapsulation to achieve acceptable flicker. Low flicker depth appears to be achievable by e.g. mixing LEDs with medium PL decay phosphor with decay time of about 5-100 ms and traditional short PL decay phosphors. A very suitable example of such phosphor (herein also indicated as "photoluminescent material") appears $K_2TiF_6:Mn^{4+}$, and other phosphors of the same class, which emit at ca. 630 nm and exhibit decay time at around 10 ms. Based on for instance these medium decay phosphors, it appeared surprisingly possible to reduce flicker with ultra-low capacity requirement. In an embodiment, at least two LED channels, in which one made of medium/long decay phosphor encapsulation and one with short decay encapsulation, was used with very good result in terms of capacitor reduction potential. Nevertheless, capacitors may be applied, but a much reduced capacitor is only applied to fill the gap for channel with short decay phosphor. Hence, the present invention can highly reduce the minimum requirement for capacity. Therefore, it enables using solid capacitor to maintain system cost and driver size at a much higher power. The flicker depth can e.g. be reduced to about 20% or lower below the safety curve for flicker.

Hence, in a first aspect the invention provides a light emitting diode (LED) lighting system (which may also be indicated as "system" or "device") comprising a string (ST) including a number of light emitting diode (LED) elements functionally connected with an AC voltage source configured to apply an input voltage (Vi) to said string (ST), wherein the string comprises a plurality of segments, with each segment comprising at least one or more of said light emitting diode (LED) elements, wherein the light emitting diode (LED) lighting system is configured to connect a first segment in the string between and driven by the input voltage when said input voltage is bigger than a first threshold, and to connect the first segment and a second segment in the string between and driven by the input voltage when said input voltage is bigger than a second threshold bigger than said first threshold, wherein each LED element comprises a light emitting diode configured to generate LED radiation, especially blue LED radiation, wherein said first segment comprises a second photoluminescent material comprising LED element, wherein the second photoluminescent material comprising LED element comprises (a) light emitting diode and (b) a second photoluminescent material configured to convert at least part of said LED radiation into second conversion radiation in the visible, and wherein said second photoluminescent material only has a decay time of the second conversion radiation smaller than 1 ms, and said second segment comprise first photoluminescent material comprising LED elements each comprising (a) light emitting diode and (b) a first photoluminescent material configured to convert at least part of said LED radiation into first conversion radiation in the visible, and wherein said first photoluminescent material only has a decay time (radiative decay time) of the first conversion radiation in the range of 1-500 ms.

Hence, with such system flicker may be reduced without the substantial need of a lot of capacitors. Further, a relatively robust and cheep system may be provided, complying with optical conditions such as with respect to a maximum flicker.

As indicated above, the lighting system comprises a string (ST) including a number of light emitting diode (LED) elements functionally connected with an AC voltage source configured to apply an input voltage (Vi) to said string (ST). This input voltage varies, as an AC voltage is applied. An AC voltage source provides power to a electrical (driver) circuit comprising said string. A rectifier, such as, a full-cycle rectifier may optionally be used to convert the alternating polarity of the AC voltage source to a positive voltage. Such rectifier may e.g. include a full wave bridge rectifier with four diodes converts AC voltage source to a positive voltage. This (rectified) AC voltage is provided to the top of the LED string. The string is divided into segments or substrings, which are connected in series. The segments, especially when including a plurality of LED elements, are sometimes also indicated as "banks" (of LED elements). The number of LED elements in the segments may be identical for each segment, but there may also be segments with unequal numbers of LED elements. Further, the LED elements in the segments may be configured in series or parallel. Combinations may also be applied; and also this may differ per segment. Further, there may also be one or more segments with a single LED element. The term "LED element" is applied as the LED element in the string may comprise a LED, such as a blue LED, without a converter, but the LED element in the string may also comprise a LED, such as a blue LED, including a converter (see also below).

Hence, the number of LED elements in said string is adaptable as the number of segments including in the string may vary. The system is configured to include the number of segments as function of the input voltage. At the highest voltage, all segments may be included, whereas with increasing voltage or decreasing voltage, the number of segments included in the string increases or decrease concomitantly.

Further, the LED lighting system, especially the electrical (driver) circuit, may include current control units. Especially, each segment is functionally coupled to such current control unit. Such current control unit is especially configured at the bottom of each segment or substring. The current control units especially include a switch, allowing or blocking the electrical current through the current control unit (especially the switch). Hence, the current control units can be enabled or disabled, depending whether the respective segment is at the specific stage the last segment in the string or is not (the last element) in the string. Note that the circuit may also be a self commutating circuit. During use, initially a first current control unit (associated with the first segment) is enabled but does not conduct current until the (rectified) AC voltage Vi rises high enough to forward bias the LED elements upstream from the first current control unit, i.e. the LED elements in the first segment are biased (all other current control units are disabled). The first current control unit is however disabled when the next downstream current control unit begins conducting and takes over (all other current control units are disabled). This occurs when the LED elements in the first two segments are biased. The sequence for the remaining stages is repeated until the last stage or the peak AC voltage is reached. The sequence is reversed on the down slope of AC voltage. For further specific embodiments, it is also referred to US2012/0262075, which is herein incorporated by reference. In general, there will be at least three segments, such as at least four segments. Hence, in an embodiment the string comprises a plurality of segments, with each segment (comprising at least one or more of said light emitting diode elements, wherein the light emitting diode lighting system is configured to bias the respective segments (in dependence of said input voltage (Vi). The term "plurality of segments" thus especially refers to at least two segments. Such circuit is sometimes also indicates as "tapped linear driver" or "tapped linear driver circuit". Tapped" because the LED elements are configured in serial with tapped points available to select segments or ore LED elements/banks of multiple LED elements at a time.

As indicated above, each LED element comprises a light emitting diode configured to generate LED radiation, especially blue LED radiation. The LED lighting system is especially configured to provide visible light (herein also indicated as "LED lighting system light"). Especially, the LED lighting system is configured to provide white light. Optionally, however, the LED lighting system may be configured to provide colored light.

At least, the one or more of said LED elements which comprise first photoluminescent material comprising LED elements, each comprise (a) light emitting diode and (b) a first photoluminescent material configured to convert at least part of said LED radiation into first conversion radiation in the visible. Hence, the LEDs used for the LED elements especially include a visible wavelength that can—at least for some of the LED elements—be used to convert into visible light of another wavelength. Hence, especially the light emitting diodes are configured to provide light having intensity in the wavelength range of 380-600 nm, especially in the range of 380-580 nm, such as in the range of 400-580 nm, especially in the blue range. Light in especially the blue or green range may efficiently be used to convert into visible light in (green), yellow, orange, and red. Assuming white light, the LED lighting system is especially based on the YB (yellow-blue) principle or on the RGB (red-green-blue) principle, though other combinations (known in the art to generate white light) may also be applied, such as RYB (yellow–blue+red) or RYGB, etc. Especially, however, blue LEDs may be applied.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm. Herein, terms like "green light", "red light", "configured to provide red light" and similar terms especially refer to radiation having a dominant wavelength in the visible in the indicated color of the visible spectrum.

One or more segments include LED elements with photoluminescent material that converts the (blue) LED radiation into visible photoluminescent material light. Specific good results were obtained with blue LEDs, with a yellow/green photoluminescent material having a fast decay time, and with a red photoluminescent material with a relatively slow decay time (see further also below). However, other embodiments are also possible (see further also below).

The photoluminescent material with a relatively slow decay is herein indicated as "first photoluminescent material" and the photoluminescent material with a relatively fast decay, at least faster than the radiative decay of the first photoluminescent material is herein also indicated as "second photoluminescent material".

The photoluminescent material may be configured to convert all LED radiation of the specific LED or only part thereof. Especially, one or more segments include LEDs of which the LED radiation is at least partly converted by the photoluminescent material into photoluminescent material light, and one or more segments include LEDs of which the radiation is not converted. Further, one or more segments may include LEDs of which the radiation is converted by a second photoluminescent material (see further below).

At least a first photoluminescent material is applied. This first photoluminescent material has a decay time of the first conversion radiation in the range of 1-500 ms. Especially, the decay time may be in the range of 2-200 ms, such as 5-100 ms, like 10-50 ms. Hence, in an embodiment first photoluminescent material has a decay time of the first conversion radiation in the range of 5-100 ms. With shorter decay times than 5 ms, such as shorter than 2 ms, the reduction of flicker may not be enough; the same applies with decay times larger than 100 ms, such as especially larger than 500 ms. The radiation may then be to slow to provide advantages in later sequences. The decay time is especially defined as the time wherein an initial luminescence intensity (such as after an excitation pulse) is reduced to 1/e of the initial intensity. Especially, at least 50% of the luminescence intensity in the visible (in Watt) has such decay time. The term "first photoluminescent material" may also refer to a plurality of different first photoluminescent materials (especially each complying with the herein indicated conditions, such as having a decay time in the range of 1-500 ms, such as in the range of 2-200 ms).

Especially, it appears that in an embodiment the use of a red photoluminescent material with a decay time in the above indicated range provides at least part of the desired flicker reduction effects. Very useful red photoluminescent appeared to be a Mn(IV) type photoluminescent material. Hence, in an embodiment the first photoluminescent material comprises a red photoluminescent material selected from the group consisting of Mn(IV) photoluminescent materials, even more especially the first photoluminescent material comprises a photoluminescent material of the type $M_2AX_6$ doped with tetravalent manganese, wherein M comprises an alkaline cation, wherein A comprises a tetravalent cation, and wherein X comprises a monovalent anion, at least comprising fluorine (F). For instance, $M_2AX_6$ may comprise $K_{1.5}Rb_{0.5}AX_6$. M relates to monovalent cations, such as selected from the group consisting of potassium (K), rubidium (Rb), lithium (Li), sodium (Na), cesium (Cs) and ammonium ($NH_4^+$), and especially M comprises at least one or more of K and Rb. Preferably, at least 80%, even more preferably at least 90%, such as 95% of M consists of potassium and/or rubidium. The cation A may comprise one or more of silicon (Si) titanium (Ti), germanium (Ge), stannum (Sn) and zinc (Zn). Preferably, at least 80%, even more preferably at least 90%, such as at least 95% of M consists of silicon and/or titanium. Especially, M comprises potassium and A comprises titanium. X relates to a monovalent anion, but especially at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. The term "tetravalent manganese" refers to $Mn^{4+}$. This is a well-known photoluminescent ion. In the formula as indicated above, part of the tetravalent cation A (such as Si) is being replaced by manganese. Hence, $M_2AX_6$ doped with tetravalent manganese may also be indicated as $M_2A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12. Further embodiments may be derived from WO2013/088313, which is herein incorporated by reference. However, also other red photoluminescent materials may be applied.

The other color(s) to constitute white light may especially be provided by a further photoluminescent material, herein also indicated as second photoluminescent material. Such second photoluminescent material may e.g. be configured to provide green and/or yellow luminescence. In combination with the red luminescence of the first photoluminescent material, and the blue LED radiation, white light may be provided. Especially, it appears beneficial when such second photoluminescent material has a relatively short decay time, and especially at least shorter than the decay time of the first photoluminescent material. Hence, in yet a further embodiment one or more of said LED elements comprise a second photoluminescent material comprising LED element comprising (a) light emitting diode and (b) a second photoluminescent material configured to convert at least part of said LED radiation into second conversion radiation in the visible, wherein said second photoluminescent material especially has a decay time of the second conversion radiation smaller than the decay time of the first photoluminescent material, especially smaller than 1 ms. The term "second photoluminescent material" may also refer to a plurality of different second photoluminescent materials (especially each complying with the herein indicated conditions, such as having a decay time shorter than the luminescence of the first photoluminescent material(s)). Further, especially the first conversion radiation and the second conversion radiation have different colors (see above for the definition of colors).

As in some of the embodiments described above the first photoluminescent material comprises a red emitting photoluminescent material, the second photoluminescent material may especially comprise a green and/or yellow emitting photoluminescent material (upon excitation with the LED radiation). Especially, the second photoluminescent material may comprise a cerium doped material, especially a cerium doped garnet type of photoluminescent material.

The (second) photoluminescent material may also comprise one or more phosphors selected from the group consisting of a trivalent cerium containing garnet and a trivalent cerium containing (oxy)nitride.

Especially, the (second) photoluminescent material may further comprise a $M_3A_5O_{12}:Ce^3$ (second) photoluminescent material, wherein M is selected from the group consisting of Sc, Y, Tb, Gd, and Lu, wherein A is selected from the group consisting of Al, Ga, Sc and In. Preferably, M at least comprises one or more of Y and Lu, and wherein A at least comprises Al and/or Ga. These types of materials may give highest efficiencies. Embodiments of garnets especially include $M_3A_5O_{12}$ garnets, wherein M comprises at least yttrium and/or lutetium and wherein A comprises at least aluminium. Such garnet may be doped with cerium (Ce), with praseodymium (Pr) or a combination of cerium and praseodymium; especially however with Ce. Especially, A comprises aluminium (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet (second) photoluminescent material comprises $(Y_{1-x}Lu_x)_3B_5O_{12}:Ce$, wherein x is equal to or larger than 0 and equal to or smaller than 1. The term ":Ce" or ":Ce$^{3+}$", indicates that part of the metal ions (i.e. in the garnets: part of the "M" ions) in the (second) photoluminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. The term "YAG" especially refers to M=Y and A=Al; the term "LuAG" especially refers to M=Lu and A=Al.

In a specific embodiment, the number of LED elements including first photoluminescent material in segments that are less on may be larger than the number of LED elements including first photoluminescent material in segments that are more often on. Alternatively or additionally, in a specific embodiment, the number of LED elements including second photoluminescent material in segments that more often on may be larger than the number of LED elements including second photoluminescent material in segments that are less on. However, in other embodiments, each segment may include one or more LED elements including the first photoluminescent material and/or one or more LED elements including the second photoluminescent material. Further, optionally one and the same LED element may include both the first photoluminescent material and the second photoluminescent material (see further also below).

In some of the embodiments described above, the first photoluminescent material, with the relative long decay time, such as at least 1 ms, like in the range of 1-500 ms, comprises a red emitting photoluminescent material. However, in alternative embodiment the first photoluminescent material comprises a photoluminescent material that is configured to provide green and/or yellow light. Hence, in yet a further embodiment the first photoluminescent material comprises a photoluminescent material configured to provide one or more of green and yellow first conversion radiation. Such embodiments are further described here below.

Hence, in embodiments the first photoluminescent material is selected from the group consisting of divalent europium containing photoluminescent materials and divalent europium and divalent manganese containing photoluminescent materials. Some of these may show decay times which are relatively long, which may improve flicker behavior (reduce flicker). Especially, the first photoluminescent material is selected from the group consisting of (i) a chlorosilicate doped with $Eu^{2+}$ and $Mn^{2+}$, (ii) an (oxy)nitride doped with $Eu^{2+}$ and $Mn^{2+}$, and (iii) an aluminate doped with $Eu^{2+}$ and $Mn^{2+}$. Especially such photoluminescent materials may have a decay time in the range of 1-500 ms.

Examples of blue and/or green photoluminescent materials having a long decay time may be selected e.g. from the group consisting of chlorosilicate:$Eu^{2+}$, $Mn^{2+}$, $MSi_2O_2N_2$:$Eu^{2+}$, $Mn^{2+}$, and $MAl_2O_4$:$Eu^{2+}$, $Ce^{3+}$, $Li^+$, wherein M is selected from the group consisting of Mg, Ca, Sr, Ba, especially M comprises at least strontium (even more especially only Sr). Chlorosilicates are e.g. described in WO2005030904, which is herein incorporated by reference. The decay time may e.g. be tuned by codoping of divalent europium with other elements, as the normal decay time of divalent europium is in general relatively short (fd transition; see also below where divalent europium doped systems are suggested as second photoluminescent material).

Optionally, a second photoluminescent material may be applied which may be configured to provide one or more of green, yellow and red, but especially substantially not in the same spectral region as the first photoluminescent material (though this is not necessarily excluded). However, as indicated above, especially the first conversion radiation and the second conversion radiation have different colors. The second photoluminescent material, also in these embodiments (like the embodiments with the first photoluminescent material emitting essentially in the red), especially has a decay shorter than the first photoluminescent material, such as especially below 1 ms.

For instance, the second photoluminescent material may (now) include a red photoluminescent material. In a further specific embodiment, the second photoluminescent material comprises one or more photoluminescent materials selected from the group consisting of divalent europium containing nitride photoluminescent material or a divalent europium containing oxynitride photoluminescent material. The second photoluminescent material may in an embodiment comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba$_5$Sr$_5$Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca). Here, Eu is introduced and replaces at least part of M i.e. one or more of Ba, Sr, and Ca). Likewise, the material (Ba$_5$Sr$_5$Ca)AlSiN$_3$:Eu can also be indicated as MAlSiN$_3$Eu$_5$ wherein M is one or more elements selected from the group consisting of barium (Ba)$_5$ strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Especially, the first second photoluminescent material comprises (Ca,Sr,Ba)AlSiN$_3$:Eu, preferably CaAlSiN$_3$:Eu. Further, in another embodiment, which may be combined with the former, the first second photoluminescent material comprises (Ca,Sr,Ba)$_2$Si$_5$N$_8$:Eu, preferably (Sr,Ba)$_2$Si$_5$N$_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc. Hence, in an embodiment the second photoluminescent material may further comprises M$_2$Si$_5$N$_8$:Eu$^{2+}$, wherein M is selected from the group consisting of Ca, Sr and Ba, even more especially wherein M is selected from the group consisting of Sr and Ba. In yet another embodiment, which may be combined with the former, the second photoluminescent material may further comprise MAlN$_3$:Eu$^{2+}$, wherein M is selected from the group consisting of Ca, Sr and Ba, even more especially wherein M is selected from the group consisting of Sr and Ba.

In yet a further specific embodiment, the first photoluminescent material comprises M$_3$A$_5$O$_{12}$:Ce$^{3+}$, wherein M is selected from the group consisting of Sc, Y, Tb, Gd, and Lu, wherein A is selected from the group consisting of Al, Ga, Sc and In, wherein M at least comprises Gd and wherein A at least comprises Al and Ga, and wherein the second photoluminescent material second photoluminescent material is configured to convert at least part of said LED radiation into second conversion radiation in the red. The first photoluminescent material has a relatively long decay time in the green and the second photoluminescent material has a relatively short decay time in the red. It surprisingly appears that viewers of this light, even though the red light is flickering, does not perceive the light of the system as flickering. Hence, in a relative easy way the flickering problem can be solved with by the use of specific slow green and fast red photoluminescent materials. Hence, it appears that for good results for instance only the green/yellow photoluminescent material may be chosen to be slow, whereas blue (LED) and red have relatively short decay times. In a specific embodiment, M$_3$A$_5$O$_{12}$:Ce$^{3+}$ comprises Gd$_3$(Al,Ga)$_5$O$_{12}$:Ce$^{3+}$. These specific types of garnets surprisingly appear to be a long decay photoluminescent material, especially Gd$_3$(A$_{1-y}$G$_y$)$_5$O$_{12}$:Ce$^{3+}$, with y especially in the range of 0.1-0.9, such as 0.2-0.8, such as 0.3-0.7, like e.g. Gd$_3$Al$_2$G$_3$O$_{12}$:Ce$^{3+}$.

The photoluminescent material, being a first photoluminescent material or a second photoluminescent material may be directly applied on e.g. a LED die, such as coated on the LED die, or may be embedded in a medium, such as a silicone, with such medium directly applied on e.g. a LED die, or may be configured remote, i.e. at a non-zero (shortest) distance from the LED die, such as at least 1 mm from the LED die, like at least 5 mm, either as layer or embedded in another material etc. The photoluminescent material may optionally be provided as ceramic slab or plate.

As indicated above, in embodiments the string comprises a plurality of segments, with each segment (comprising at least one or more of said light emitting diode elements). Especially, the light emitting diode lighting system is configured to bias the respective segments in dependence of said input voltage (Vi). In a specific embodiment, the light emitting diode lighting system is configured to connect a first segment in the string when said input voltage (Vi) is bigger than a first threshold, and to connect the first segment and a second segment in the string when said input voltage (Vi) is bigger than a second threshold bigger than said first threshold, etc. etc., wherein especially a first segment comprises a second photoluminescent material comprising LED element, and wherein a second segment comprises said first photoluminescent material comprising LED element. Especially, the second photoluminescent material comprising LED element is configured to provide second LED element radiation comprising blue light and one or more of green light and yellow light, especially yellow light.

As indicate above, a reduction of electronic components is desirable. Introducing the first photoluminescent material and optionally the second photoluminescent material may reduce flicker already with 10% or more. Nevertheless, a further flicker reduction may be obtained when configuring parallel to one or more segments a capacitor. Hence, in a specific embodiment parallel to one or more of said segments capacitors are configured. Further, especially when using such capacitor(s), between said segments (non-light emitting) diodes are configured. This may further stabilize the circuit.

In a specific embodiment, the light emitting diode (LED) lighting system comprises one or more segments comprising the first photoluminescent material and wherein one or more other segments do not comprise the first photoluminescent material, wherein parallel to one or more of said one or more segments not comprising the first photoluminescent material capacitors are configured.

Hence, in embodiments the first photoluminescent material comprising LED elements comprise one or more of the herein described red emitting first photoluminescent materials and green first photoluminescent materials and yellow first photoluminescent materials.

In yet a further embodiment, the number of LED elements in a first string is bigger than the number of LED elements in a second string, and wherein the LED elements in the first string comprise said first photoluminescent material and wherein the LED elements in the second string comprise said second photoluminescent material.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
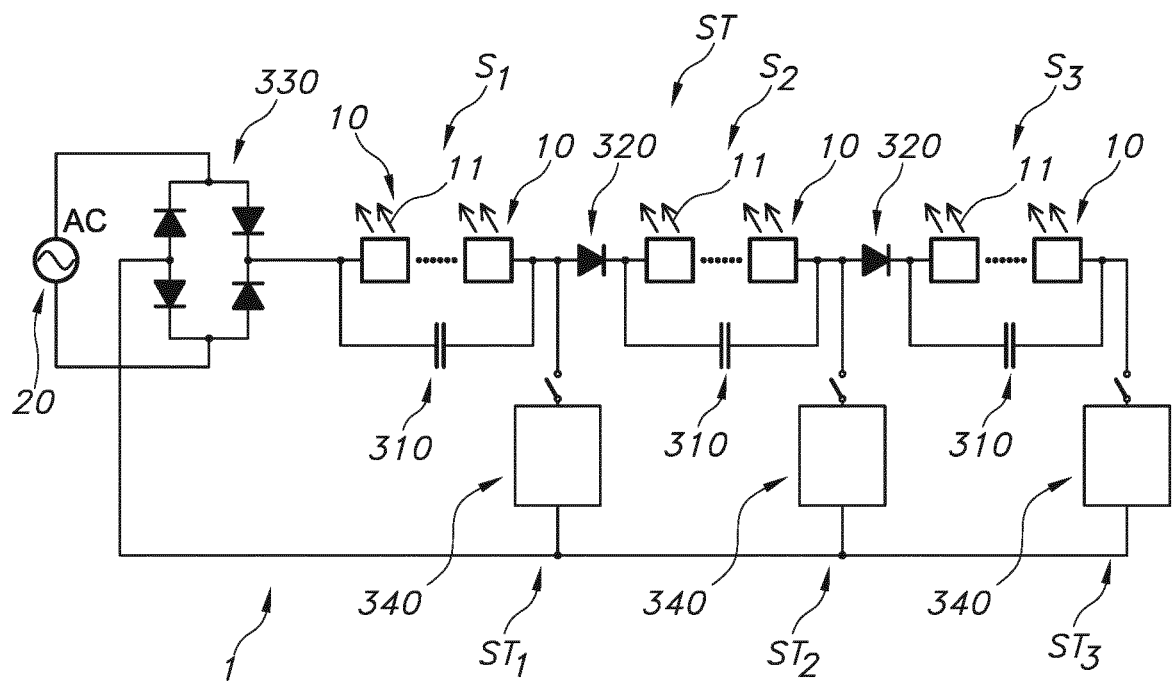
FIGS. 1a-1c schematically depict some aspects of the lighting system.

FIG. 1a schematically depicts LED lighting system 1 comprising a string ST including a number of light emitting diode LED elements 10 functionally connected with an AC voltage source 20 configured to apply an input voltage Vi to said string ST. The number of LED elements 10 in said string is adaptable in dependence of said input voltage Vi. At a low voltage only the first segment may be biased, at an intermediate voltage both the first and the second, and at a high voltage all three segments. Hence, the light emitting diode (LED) lighting system 1 is configured to bias the respective segments S1, S2, S3, . . . in dependence of said input voltage Vi. Note that only—by way of example—three segments S1-S3 are depicted. References ST1-ST3 indicate (sub)strings. ST3 is the full string at e.g. maximum voltage, and ST1 refers to the string including only the first segment S1. Reference 330 indicates an optional rectifier. Reference 340 indicates a current control unit which is configured at the bottom of each segment or substring. The current control units especially include a switch, allowing or blocking the electrical current through the current control unit (especially the switch). Further, the current control unit may include current regulators or current sources. For instance, such current regulator may only allow a current unit a specific voltage threshold is reached. The current control units 340 may be functionally be coupled to increase and decrease the number of LEDs in the string in dependence of the input voltage. Reference 11 indicates the light emanating from the LED element 10.

Figure 1B:
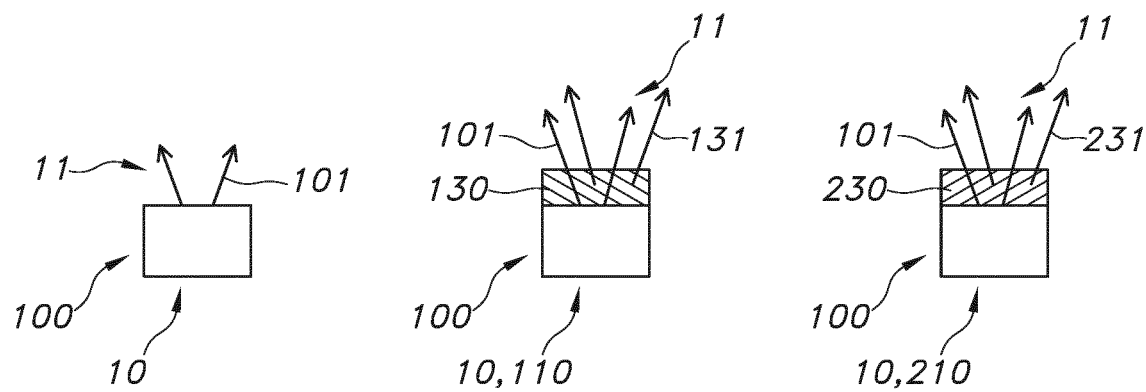

Each LED element 10 comprises a light emitting diode 100 configured to generate blue LED radiation 101 (see FIG. 1b; left device), wherein one or more of said LED elements 10 comprise first photoluminescent material comprising LED elements 110 (see device in the middle in FIG. 1b) each comprising a light emitting diode 100 and a first photoluminescent material 130 configured to convert at least part of said LED radiation 101 into first conversion radiation 131 in the visible. As indicated above, especially the first photoluminescent material 130 has a decay time of the first conversion radiation 131 in the range of 1-500 ms. Optionally, one or more of the LED elements 10, as schematically depicted in the system 1 of FIG. 1a, may comprise second photoluminescent material comprising LED elements 210 each comprising a light emitting diode 100 and a second photoluminescent material 230 configured to convert at least part of said LED radiation 101 into second conversion radiation 231 in the visible (see FIG. 1b, right device), and wherein said second photoluminescent material 230 has a decay time of the second conversion radiation 231 smaller than 1 ms. Note that the light downstream of the middle and right device may include at least the photoluminescent material light 131,231, but optionally also LED radiation 101. Reference 11 indicates light emanating from the LED element. It may e.g. essentially consist of blue LED radiation 101, but may alternatively or additionally also include one or more of the first conversion radiation 131 and the second conversion radiation 231.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

Capacitors 310 and diodes 320 are optional. Hence, optionally parallel to one or more of said segments S1, S2, S3, . . . capacitors 310 may be configured, and further optionally between said segments S1, S2, S3, . . . diodes 320 are configured.

Figure 1C:
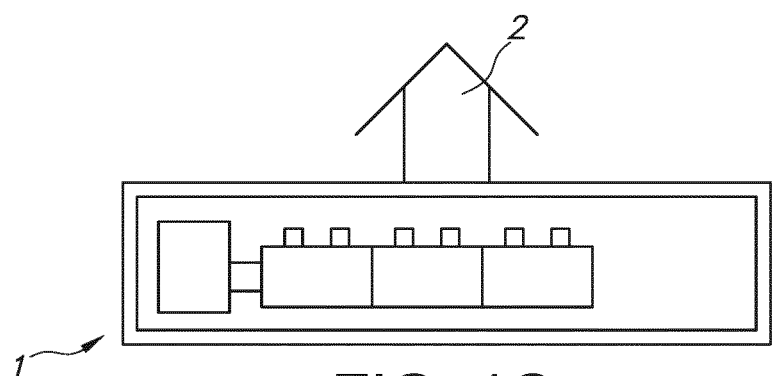

FIG. 1c very schematically depicts the LED lighting system 1 configured to provide LED lighting system light 2 in the visible (especially white light (for the perceiver)). The light composition may change over time due to the AC voltage, and dependent upon the arrangement of the photoluminescent material(s) in the LED elements 10 or on the light emitting diode 100 or remote from the light emitting diode 100, etc. As indicated above in relation to FIG. 1b, also the LED lighting system light 2 essentially consist of blue LED radiation 101, but may alternatively or additionally also include one or more of the first conversion radiation 131 and the second conversion radiation 231.

Figure 2A:
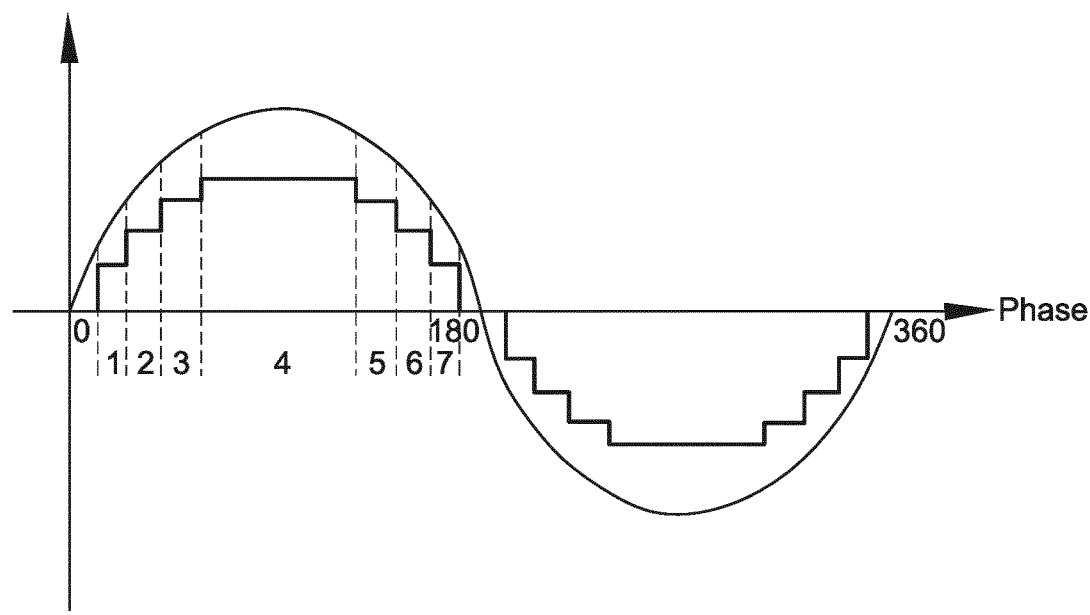
FIGS. 2a-2b schematically depict some aspects of the lighting system and influence on flicker.

FIG. 2a schematically depicts a situation with an unacceptable flicker depth, in the interval 1 only the first segment LED is on, in the internal 2 the first and second segments LED is on, in the internal 3 the first, second and third segments LED is on, in the internal 4 all segments LED is on, after that the segments are gradually reduced again, in the internal 5 the first, second and third segments LED is on, in the internal 6 the first and second segments LED is on, and in the internal 7 only the first segment LED is on. In this schematic drawing, on the x-axis the phase is indicated and on the y axis the AC line voltage as smooth curve and the AC input current as stepped curve.

In an example, the AC-LED module is made of two LED channels with the color points to mix into white light. With 93% PL efficiency of red phosphor at 630 nm and WPE (wall plug efficiency) of 0.5 for blue LEDs (considering system losses), the red LED package will give a lumen efficiency of ~50 lm/w. The lumen efficiency for green LEDs at given color point is calculated to be 155 lm/w with PL efficiency of 95% and WPE of 0.5. The system efficiency for this structure will be about 115 lm/w, which is at the same level of current solution. Since the lumen efficiency of red LEDs is much lower than green ones, the total calculated power contributions for the two channels are close to 1:1. The accurate power ratio depends on estimated color temperature and CRI.

Figure 2B:
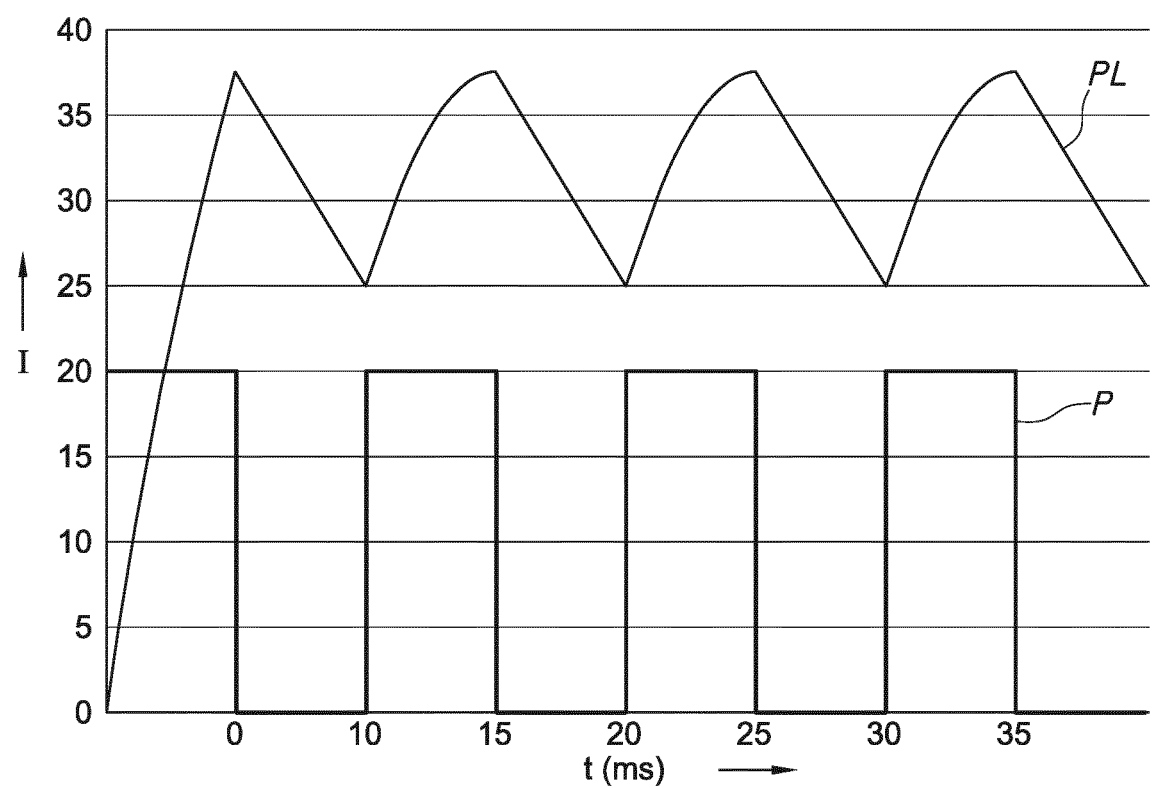

FIG. 2b provides a schematic illustration of photoluminescence (PL) generated from medium decay phosphor with pulsed input power. This shows the damping by the photoluminescent material. The blocked curve schematically represents the input power and the sawtooth schematically depicts the photoluminescence (PL). On the x-axis the time in milliseconds (ms) is indicated and on the y-axis the intensity. A simulation for time resolute PL/lm intensity generated from the given red phosphor vs. input power is given in this FIG. 2b. The power is given as a pulse for each 10 ms and last for 5 ms and another 5 ms blank. It assumes that the phosphor has decay rate of 10 ms and each group of phosphor dots become saturated under irradiation during the given time and emit light graduate within 10 ms. It may gives about <10% flicker index for such phosphor running at given conditions. Under real application environment, the power on time is normally larger and the flicker depth can be further reduced.

In an example the invention includes an AC-input LED system, two or more LED channels or segments; at least one channel or segment may include LEDs which are encapsulated with medium PL decay phosphor (decay rate is within the range of 1 ms-200 ms) such as $K_2TiF_6:Mn^{4+}$, and at least one channel is made of LEDs which are encapsulated with short PL decay phosphor, such as YAG:Ce, decay rate is within the range of <100 us). The system may include no capacitor or only a low amount of capacitor.

Figure 3A:
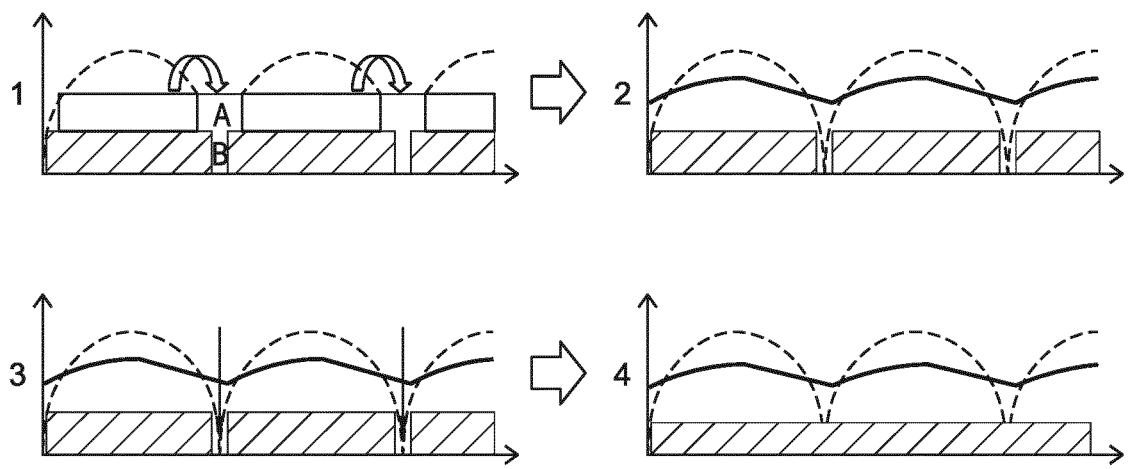
FIGS. 3a-3b schematically depict some aspects of the lighting system.

FIG. 3a provides a schematic illustration of light emitting effect by using medium PL decay phosphor in one channel and by further introducing additional solid capacitor. Here we developed one architect with hybrid three LED channels or segments, as shown in FIG. 3a. One channel covers all power on state is made of LEDs encapsulated with green-yellow short PL decay phosphors such as YAG/LuAG. The other channels are LEDs encapsulated with red medium PL decay phosphor such as $K_2TiF_6:Mn^{4+}$. By simply introducing medium PL decay red phosphor, the flicker index can be reduced from 48% to about 40%; which is good reduction of the flicker (upper two drawings, showing the change from 1 to 2). However, further flicker reduction may be desired. The time slot at area A has been largely covered. To further reduce flicker, only the time slot B for green channel may have to be filled in order to achieve desired flicker depth. Since the area B is much smaller than area A, it requires much lower capacity to store energy in order to fill the gap. This is shown in the two lower drawings, with the change from 3-4. With such additional capacitor, flicker can be reduced from about 48% to 10%, which is a very desirable flicker value.

The capacity according to given design for a typical AC-LED with total 5 W input power was calculated. Input voltage is 220 Vac~240 Vac, typical rated input voltage is 230 Vac. As shown in FIG. 1a, it is a typical 3-segment LED driver solution. Refs. 340 refer to three current control units including three current sources and including three switches, which are controlled according to input voltage. When Vi is higher than the voltage of LED string ST1 but lower than the voltage of LED string ST1, S11 is on, ST2 and ST3 are off (no current through the second and third current control units 340). When Vi is higher than the voltage of LED string ST2 plus LED string ST2 voltage but lower than the voltage of LED $ST1+ST^{2+}ST23$, ST1 and ST3 are off, and ST2 is on (no current through the first and third and third current control units 340). When Vi is higher than the voltage of LED $ST1+ST^{2+}ST23$, ST3 is on and ST1 and ST2 are off (no current through the first and second current control units 340).

In an experiment, in order to achieve good efficiency, high LED utilization and low cost, six HV (22V) short decay green LEDs are selected to form LED ST1 (i.e. included in the $1^{st}$ segment), and the string voltage is 132V. Four HV medium decay red LEDs are selected to form LED ST2 (i.e. included in the $2^{nd}$ segment), three HV medium decay red LED are selected to form LED ST3 (i.e. included in the $3^{rd}$ segment). The current on each string is 200 mA via the first current control unit, 240 mA via the second current control unit, and 280 mA via the third current control unit, respectively.

Figure 3B:
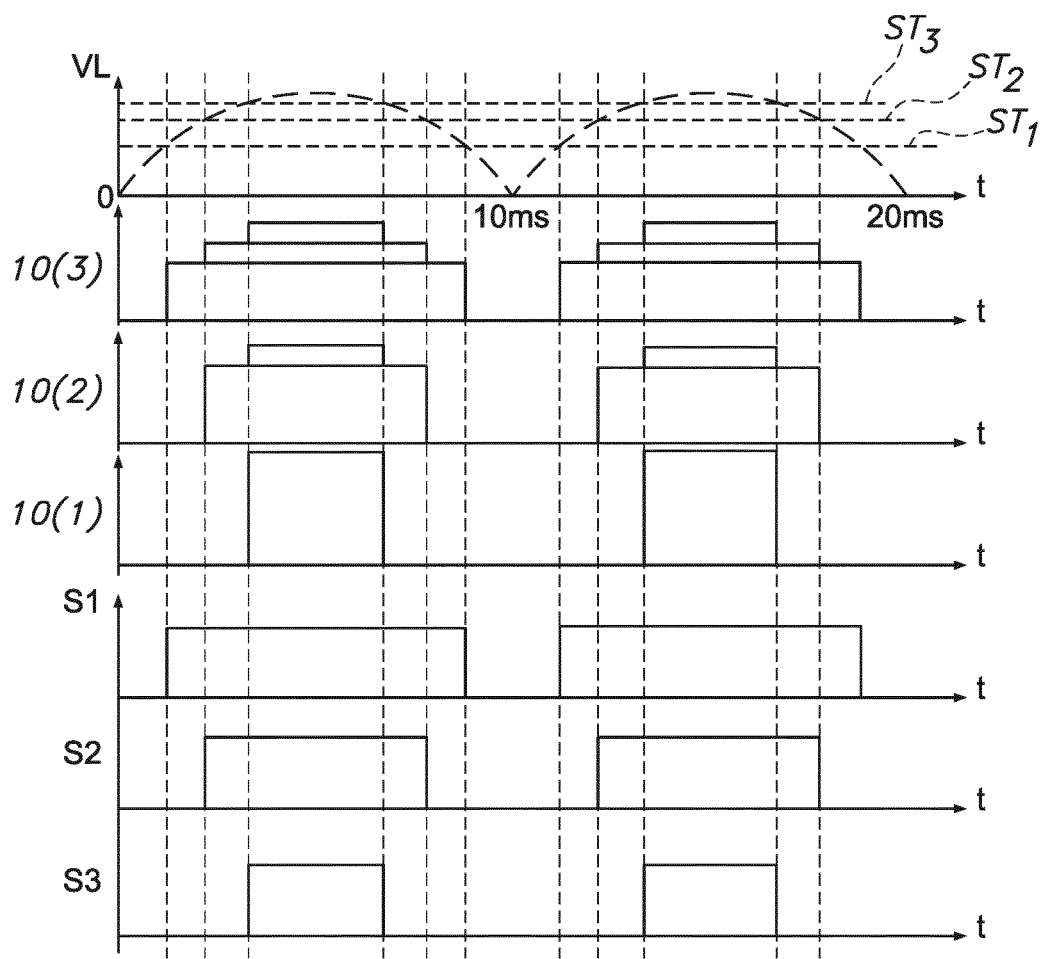

The waveforms for operation of this design are schematically shown in FIG. 3b. Electronic capacitors are selected to filter the current ripple flowing through LED string. Since the red light ripple is reduced by medium decay phosphor, capacitor may only needed for the first LED string ST1 (here green light). Through calculation, 8 uF/150V capacitor is needed to reduce the ripple current to +/−30% of average current for LED string ST1, which together with red channels gives a flicker index of about 10%. Total flicker index is still less than 10% plus red channel. According to traditional solution, 20 uF/100 v and 35 uF/100 v of capacitors are needed for LED string ST2 (red) and LED string ST3 (red). Therefore, almost >60% of capacitor can be reduced to achieve lower cost. In additional, for e.g. a 5 W AC-LED module one may use a ceramic capacitor to achieve full SMD (shared memory driver) on board, that will highly simplify the manufacturing and application of AC-LED module. Cost and reliability may thereby also be improved.

Below, the concept with a green/yellow long decay photoluminescent material (decay time in the range of 1-500 ms) is further discussed.

Using a blue LED driven on a tapped linear driver, such as described above, in combination with a normal LED phosphor, a 100% modulation of the light output is observed, resulting in strong stroboscopic effects (see also above). In this situation there is no color point variation (the color of the light is white if LED is on, black if LED is off); the amount of light emitted by the phosphor is proportional to the amount of LED light to pump the phosphor at any time. In case the decay time of the phosphor is increased, the modulation depth for the phosphor emission decreases. Some distortion of the blue input signal is observed. Since the brightness is determined by the light emitted by e.g. the green phosphor (and to some extend by the red phosphor), the brightness modulation decreases. When e.g. hypothetically a decay time of a phosphor is increased to 5 ms, the modulation depth of the light emitted by the phosphor decreases to ~65%. The amount of phosphor material needed to get the correct color point increases slightly (some of the phosphor is excited and does not contribute to the color conversion). Although luminescence modulation is limited, some color variation is introduced: during the on-time of the LED the light generated is a combination of blue and green (too high blue content), whereas the color point in the off-period of the LED is green only.

By tuning the phosphor decay time the luminance modulation can be diminished to the desired level. Increasing the decay time reduced the luminance modulation, but increases the color point modulation. Also the amount of phosphor needed may increase, resulting in a drop of the package efficiency. The best option may thus be to optimize the decay time of the phosphor to get the luminance modulation at a desired level.

A user test was performed using AC-LEDs and TLLED. The outcome of the perception test was that color modulations are acceptable. Luminance modulations are perceived to be annoying and should thus be minimized. A modulation depth below 40% resulted in a high user acceptance.

Hence, in an embodiment it is proposed to make a white LED using a blue LED, a slow (such as about 10-50 ms) yellow/green phosphor. If needed a red phosphor can be added (lower CCTs, higher CRI). The red phosphor can be a usual red LED phosphor with a short decay time (such as the above indicated nitrides doped with divalent europium), as the contribution of its emission to the luminance is small. Due to the use of a single slow decaying phosphor (emitting in the yellow/green), luminance modulations are controlled and therefore use of drivers or LEDs with modulating current are acceptable. Some examples of yellow-green emitting phosphors with long decay time and blue absorption are: chlorosilicate:$Eu^{2+}$, $Mn^{2+}$, $MSi_2O_2N_2$:$Eu^{2+}$, $Mn^{2+}$, and $MAl_2O_4$:$Eu^{2+}$, $Ce^{3+}$, $Li^+$, wherein M is selected from the group consisting of Mg, Ca, Sr, Ba, especially M comprises at least strontium.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A light emitting diode (LED) lighting system comprising: a string including a number of LED elements functionally connected with an AC voltage source configured to apply an input voltage to said string, wherein the string comprises a plurality of segments, with each segment comprising at least one or more of said LED elements,
   wherein the LED lighting system is configured to connect a first segment in the string between and driven by the input voltage when said input voltage is bigger than a first threshold, and to connect the first segment and a second segment in the string between and driven by the input voltage when said input voltage is bigger than a second threshold bigger than said first threshold,
   wherein each LED element comprises a LED configured to generate blue LED radiation,
   said first segment comprises a second photoluminescent material comprising LED element, wherein the second photoluminescent material is configured to convert at least part of said LED radiation into second conversion radiation in the visible, and wherein said second photoluminescent material only has a decay time of the second conversion radiation smaller than 1 ms, and
   said second segment comprises a first photoluminescent material comprising LED elements, wherein the first photoluminescent material is configured to convert at least part of said LED radiation into first conversion radiation in the visible, and wherein said first photoluminescent material only has a decay time of the first conversion radiation in the range of 1-500 ms.

2. The LED lighting system according to claim 1, wherein said first photoluminescent material has a decay time of the first conversion radiation in the range of 5-100 ms.

3. The LED lighting system according to claim 1, wherein said first photoluminescent material is configured to provide red first conversion radiation.

4. The LED lighting system according to claim 3, wherein the first photoluminescent material comprises a red light-emitting photoluminescent material selected from the group consisting of Mn(IV) photoluminescent materials.

5. The LED lighting system according to claim 3, wherein the first photoluminescent material comprises a photoluminescent material of the type $M_2AX_6$ doped with tetravalent manganese, wherein M comprises an alkaline cation, wherein A comprises a tetravalent cation, wherein X comprises a monovalent anion, at least comprising fluorine, wherein M comprises potassium, and wherein A comprises titanium.

6. The LED lighting system according to claim 1, wherein the first photoluminescent material comprises a photoluminescent material configured to provide one or more of green and yellow first conversion radiation.

7. The LED lighting system according to claim 6, wherein the first photoluminescent material is selected from the group consisting of divalent europium containing photoluminescent materials and divalent europium and divalent manganese containing photoluminescent materials, wherein the first photoluminescent material is further selected from the group consisting of (i) a chlorosilicate doped with $Eu^{2+}$ and $Mn^{2+}$, (ii) an (oxy)nitride doped with $Eu^{2+}$ and $Mn^{2+}$, and (iii) an aluminate doped with $Eu^{2+}$ and $Mn^{2+}$.

8. The LED lighting system according to claim 1, wherein the first photoluminescent material comprises $M_3A_5O_{12}$:$Ce^{3+}$, wherein M is selected from the group consisting of Sc, Y, Tb, Gd, and Lu, wherein A is selected from the group consisting of Al, Ga, Sc and In, wherein M further comprises Gd and wherein A further comprises Al and Ga, and wherein the second photoluminescent material is configured to convert at least part of said LED radiation into second conversion radiation in the red.

9. The LED lighting system according to claim 1, wherein the first conversion radiation and the second conversion radiation have different colors.

10. The LED lighting system according to claim 1, wherein parallel to one or more of said segments capacitors are configured, and wherein between said segments diodes are configured.

11. The LED lighting system according to claim 1, wherein the LED lighting system comprises one or more segments comprising the first photoluminescent material and wherein one or more other segments do not comprise the first photoluminescent material, wherein capacitors are configured parallel to one or more of said one or more other segments.

12. The LED lighting system according to claim 1, wherein said first photoluminescent material comprising LED elements comprise a photoluminescent material configured to provide one or more of green and yellow first conversion radiation.

13. The LED lighting system according to claim 1, wherein the number of LED elements in the first segment is bigger than the number of LED elements in the second segment.

* * * * *